(12) United States Patent
Wang

(10) Patent No.: US 12,170,122 B2
(45) Date of Patent: Dec. 17, 2024

(54) TECHNIQUES FOR INITIALIZING MEMORY ERROR CORRECTION

(71) Applicant: Micron Technology, Inc., Boise, ID (US)

(72) Inventor: Kai Wang, Shanghai (CN)

(73) Assignee: Micron Technology, Inc., Boise, ID (US)

(*) Notice: Subject to any disclaimer, the term of this patent is extended or adjusted under 35 U.S.C. 154(b) by 178 days.

(21) Appl. No.: 17/740,823

(22) Filed: May 10, 2022

(65) Prior Publication Data

US 2023/0368856 A1 Nov. 16, 2023

(51) Int. Cl.
*G11C 7/00* (2006.01)
*G11C 7/06* (2006.01)
*G11C 7/10* (2006.01)
*G11C 29/12* (2006.01)
*G11C 29/42* (2006.01)

(52) U.S. Cl.
CPC ............... *G11C 29/42* (2013.01); *G11C 7/06* (2013.01); *G11C 7/1048* (2013.01); *G11C 29/1201* (2013.01); *G11C 29/12015* (2013.01)

(58) Field of Classification Search
CPC . G06F 11/106; G11C 29/42; G11C 29/12015; G11C 11/4087; G11C 7/1048; G11C 29/52; G11C 29/1201; G11C 7/06; G11C 8/10; G11C 11/221; G11C 11/2253; G11C 8/12; G11C 2029/0409; G11C 2029/0411
USPC .......................................... 365/189.16, 189.14
See application file for complete search history.

(56) References Cited

U.S. PATENT DOCUMENTS

| | | | |
|---|---|---|---|
| 2020/0167088 A1* | 5/2020 | Richter | G06F 13/4243 |
| 2021/0020213 A1* | 1/2021 | Mirichigni | G11C 11/2275 |
| 2021/0193209 A1* | 6/2021 | Swami | G11C 11/2259 |
| 2021/0375332 A1* | 12/2021 | Akamatsu | G11C 5/147 |

* cited by examiner

*Primary Examiner* — Son T Dinh
(74) *Attorney, Agent, or Firm* — Holland & Hart LLP

(57) ABSTRACT

Methods, systems, and devices for techniques for initializing memory error correction are described. A memory system may perform operations relating to writing data to multiple memory cells belonging to one or more rows of the memory system in response to a single write command. For example, the memory system may receive (e.g., from a host system) an activation command (e.g., a row group activation command) indicating a row group address. The memory system may activate a set of rows indicated by the row group address. In response to a write command (e.g., a row group write command), the memory system may write data in a respective memory cell of each row indicated by the row group address. For example, each memory cell to be written may correspond to a column address included in the write command. The memory system may write a same logic state to each memory cell.

25 Claims, 7 Drawing Sheets

TECHNIQUES FOR INITIALIZING MEMORY ERROR CORRECTION

FIELD OF TECHNOLOGY

The following relates to one or more systems for memory, including techniques for initializing memory error correction.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
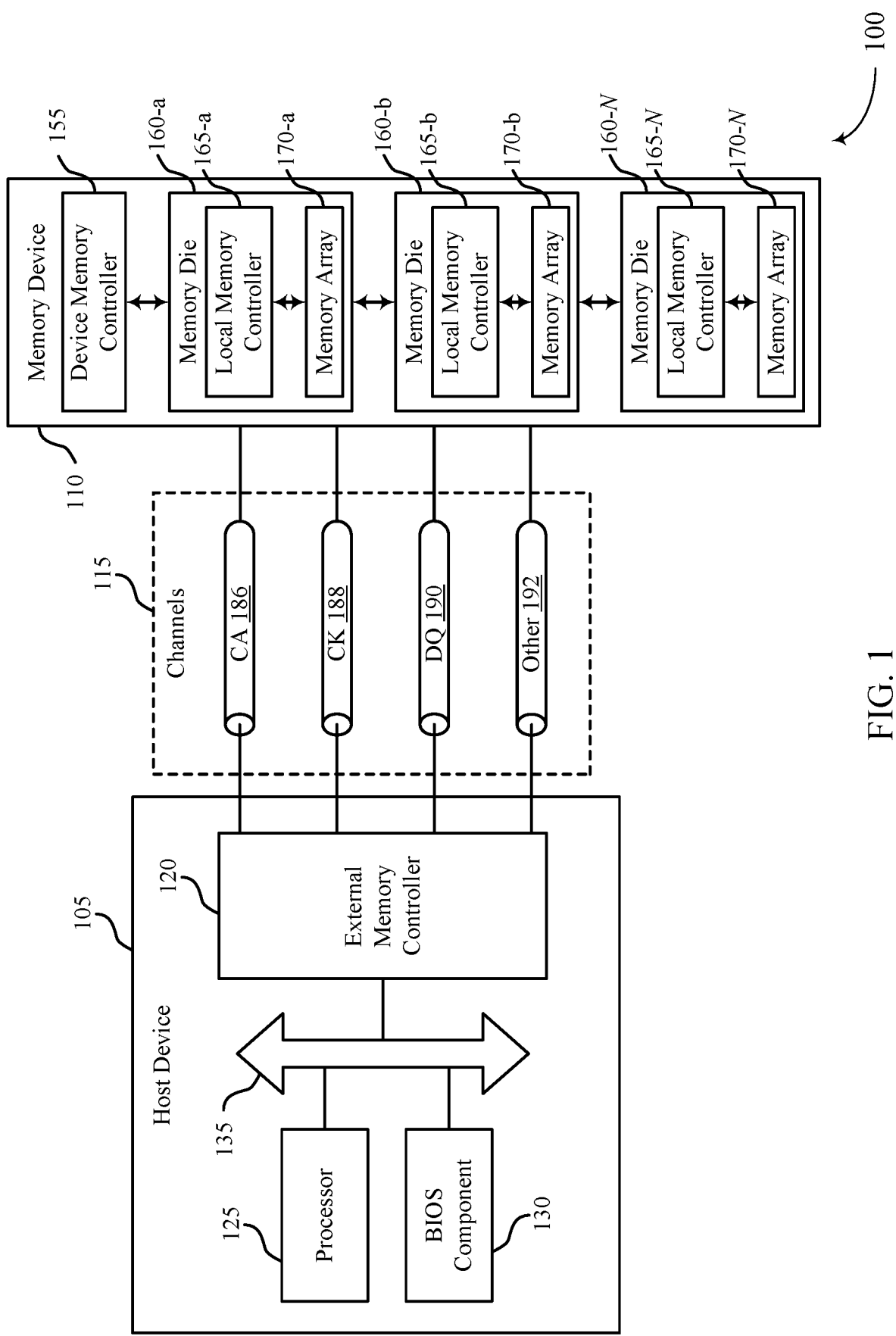
FIG. 1 illustrates an example of a system that supports techniques for initializing memory error correction in accordance with examples as disclosed herein.

Some memory systems, such as volatile memory systems (e.g., memory systems that include volatile memory cells, such as DRAM memory cells) may incur errors or experience performance issues due to varying conditions. For example, various types of interference (e.g., system noise, cosmic rays, among other examples) may cause the data contents in a memory cell to be changed (e.g., flipped) and may cause single-bit errors (SBEs), double-bit errors (DBEs) or multi-bit errors (MBEs) within a memory array. To correct errors, a memory system may perform periodic reads (e.g., scrubs) in codewords stored in a memory array of a memory system, so that all codewords are accessed and checked by a host system (e.g., an error correcting code (ECC) block of the host system) within a time period. However, after a start-up procedure (e.g., a power-on reset (POR) procedure), data contents in a memory array may be unpredictable and inaccurate, and the data region and parity regions may not match (e.g., by a host system). Performing a read operation at a memory address that has not been written since the start-up procedure may result in an error, such as a parity error, which may lead to an uncorrectable error. Thus, a memory system may perform a scrub on all data contents in the memory array (e.g., may perform a full memory scrub) before performing a read operation. The full memory scrub may be time-consuming and resource intensive, however, and may increase the overall boot-time for a system.

In accordance with examples disclosed herein, a memory system may perform operations relating to writing (e.g., recording) data to multiple memory cells belonging to one or more rows of the memory system in response to a single write command. For example, a memory system may receive (e.g., from a host system) an activation command (e.g., a row group activation command) indicating a row group address. The memory system may activate (e.g., open) a set of rows indicated by the row group address. For example, the row group address in the activation command may be or indicate one or more bits, such as one or more most significant bits (MSBs), of the memory addresses for the rows in the set of rows. In response to a write command (e.g., a row group write command), the memory system may write data in a respective memory cell of each row indicated by the row group address. For example, each memory cell to be written may correspond to a column address included in the write command. The memory system may write a same logic state (e.g., indicated in the write command) to multiple memory cells (e.g., each memory cell). In response to a precharge command (e.g., a row group precharge command), the memory system may deactivate (e.g., close) the set of rows opened by the activation command.

Features of the disclosure are initially described in the context of systems and dies as described with reference to FIGS. 1 and 2. Features of the disclosure are described in the context of a system as described with reference to FIG. 3. These and other features of the disclosure are further illustrated by and described with reference to an apparatus diagram and flowcharts that relate to techniques for initializing memory error correction as described with reference to FIGS. 4-7.

FIG. 1 illustrates an example of a system 100 that supports techniques for initializing memory error correction in accordance with examples as disclosed herein. The system 100 may include a host device 105, a memory device 110, and a set of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105), and may be an example of an SoC.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105. Additionally, the memory device 110 may receive activation commands, write commands, and precharge commands from the host device 105 related to storing data in multiple more memory cells as described herein.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, data channels 190 may be operable to communicate information (e.g., data, control information) between the host device 105 and the memory device 110. For example, the data channels 190 may communicate information (e.g., bi-directional) to be written to the memory device 110 or information read from the memory device 110.

In some cases, the memory device 110 may incur errors or experience performance issues due to varying conditions. For example, interference may cause the data contents in a memory cell of the memory device 110 to be changed (e.g., flipped) and may cause SBEs, DBEs, or MBEs. To correct or detect errors, the system 100 may perform periodic reads (e.g., scrubs) to data stored in the memory device 110 so that all codewords are accessed and checked by the host device 105 within a time period. However, after a start-up procedure, data contents in the memory device 110 may be unpredictable and inaccurate, and the data region and parity regions may not be matched (e.g., by the host device 105). Performing a read operation at a memory address that has not been written since the start-up procedure may result in a parity error, which may lead to an uncorrectable error. Thus, the system 100 may perform a scrub on all data contents in the memory arrays 170 (e.g., perform a full memory scrub) before performing a read operation. The full memory scrub may be time-consuming and resource intensive, however, and may increase the overall boot-time for the system 100.

In some examples, a memory device 110 may perform operations relating to writing (e.g., recording) data to multiple memory cells belonging to one or more rows of the memory device 110 in response to a write command. For example, a memory device 110 may receive an activation command from a host device 105 indicating a row group address. The memory device 110 may activate (e.g., open) a set of rows indicated by the row group address. For example, the row group address in the activation command may be or indicate one or more MSBs of the memory addresses for the rows in the set of rows. In response to a write command sent by the host device 105, the memory device 110 may write data in a respective memory cell of each row indicated by the row group address. For example, each memory cell to be written may correspond to a column address included in the write command. The memory device 110 may write a same logic state (e.g., indicated in the write command) to each memory cell. The memory device 110 may receive a precharge command from the host device 105, and the memory device 110 may deactivate (e.g., close) the set of rows opened by the activation command in response to the precharge command. By performing write operations concurrently to multiple memory cells, the system 100 may perform large write procedures such as a full memory scrub more efficiently.

Figure 2:
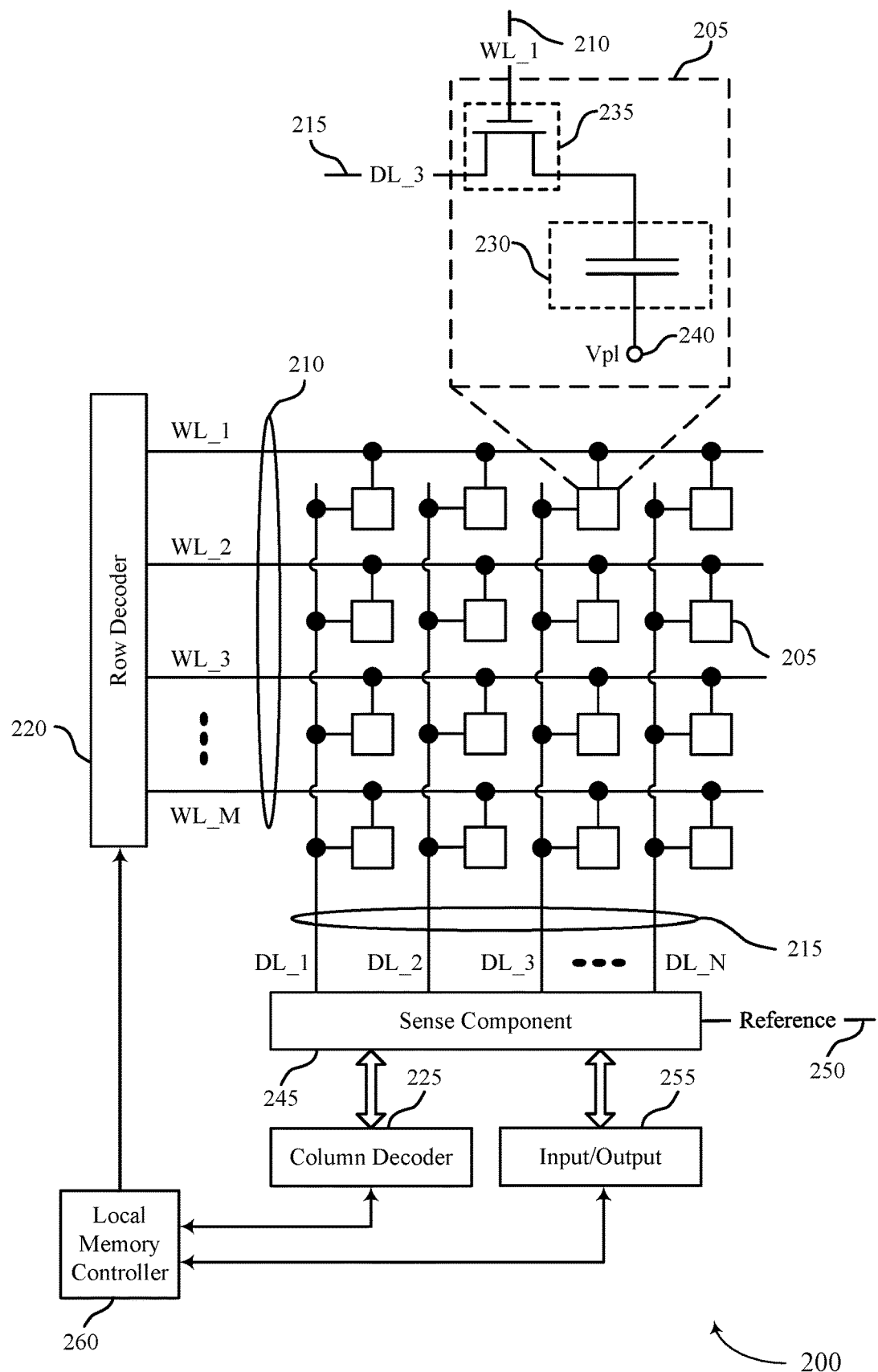
FIG. 2 illustrates an example of a memory die that supports techniques for initializing memory error correction in accordance with examples as disclosed herein.

FIG. 2 illustrates an example of a memory die 200 that supports techniques for initializing memory error correction in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address. In some examples, the row decoder 220 may enable the activation of multiple word lines 210 concurrently. For example, the row decoder 220 may receive a row group address from the local memory controller 260 and activate a group of word lines 210 based on the received row group address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

In some cases, a memory die 200 may incur errors or experience performance issues due to varying conditions. Periodic reads of the memory cells 205 may be performed to avoid these issues. However, after a start-up procedure, data contents in memory cells 205 of the memory die 200 may be unpredictable and inaccurate, and data regions and parity regions may not match (e.g., by a host device). Performing a read operation, such as the periodic read operations, on a memory cell 205 that has not been written since the start-up procedure may result in a parity error, which may lead to an uncorrectable error. Thus, a scrub on all data contents in the memory die 200 (e.g., a full memory scrub) may be performed. The full memory scrub may be time-consuming and resource intensive, however, and may increase the overall boot-time for a system.

The local memory controller 260 may be configured to perform a write operation (e.g., a programming operation) on multiple memory cells 205 of the memory die 200. The local memory controller 260 may identify target memory cells 205 on which to perform the write operation. The local memory controller 260 may identify a target digit line 215 and multiple target word lines 210 coupled with the target memory cells 205. The local memory controller 260 may activate the target word lines 210 and the target digit line 215 (e.g., applying a voltage to the word lines 210 or digit line 215) to access the target memory cells 205. The local memory controller 260 may apply a signal (e.g., a write pulse, a write voltage) to the digit line 215 during the write operation to store a logic state (e.g., charge) in the capacitor 230 of each of the memory cells 205. The signal used as part of the write operation may include one or more voltage levels over a duration. By concurrently performing write operations on multiple memory cells 205 of the memory die 200, large write procedures such as full memory scrubs may be performed with greater efficiency.

Figure 3:
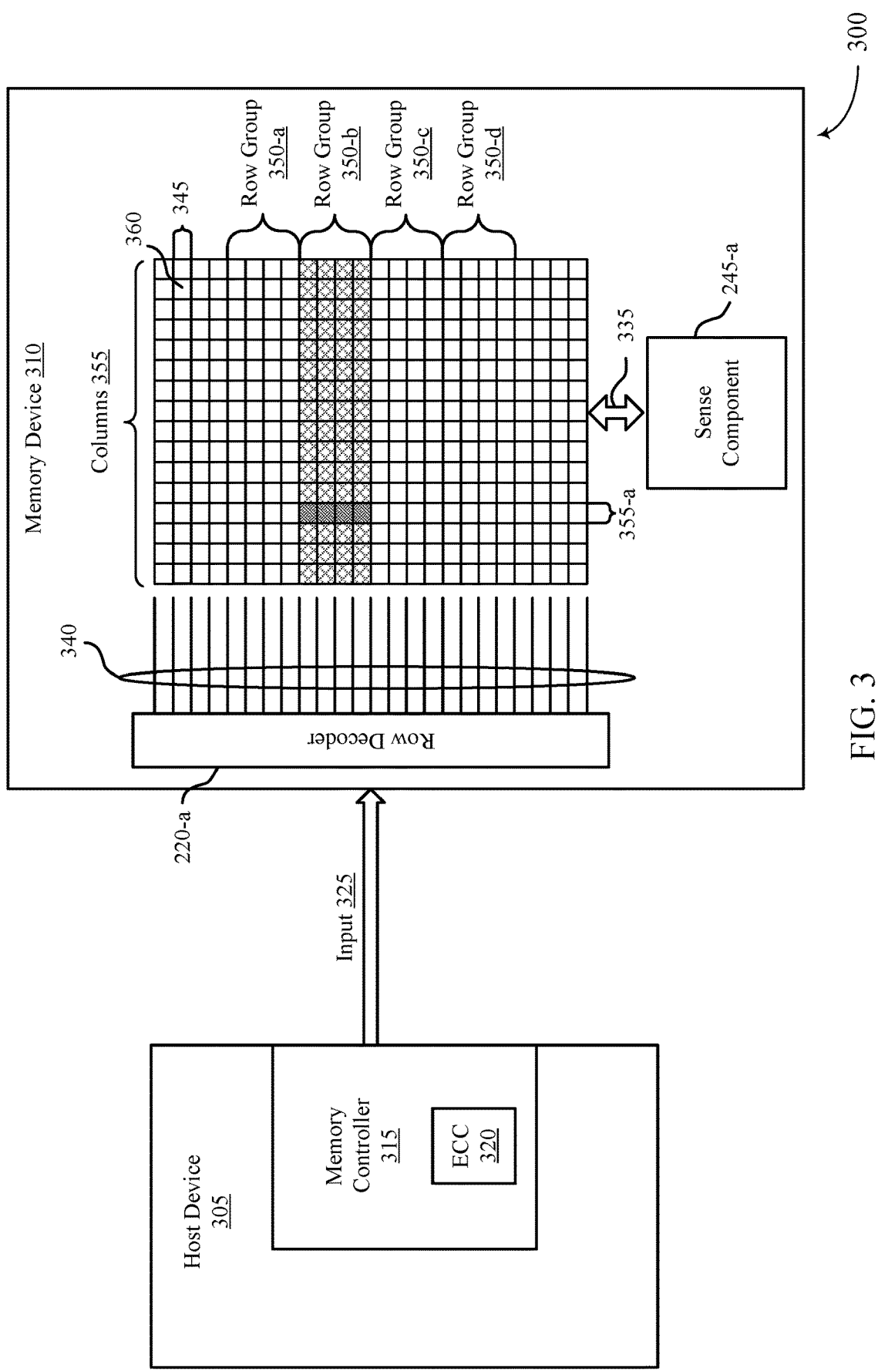
FIG. 3 illustrates an example of a memory system that supports techniques for initializing memory error correction in accordance with examples as disclosed herein.

FIG. 3 illustrates an example of a memory system 300 that supports techniques for initializing memory error correction in accordance with examples as disclosed herein. Memory system 300 may include host device 305 and memory device 310. Host device 305 may include memory controller 315 (which may be an example of an external memory controller as described with reference to FIG. 1), which may include ECC 320, and may communicate with memory device 310 (which may be an example of a memory device 110 as described with reference to FIG. 1) via input 325. Memory device 310 may include a row decoder 220-a and a sense component 245-a, which may be examples of corresponding devices as described herein with reference to FIG. 2. In some examples, the row decoder 220-a may be modified to support activating multiple rows 345.

Memory device 310 may utilize DRAM, FeRAM, or other types of memory to store data in memory cells 360 (e.g., data cells, cells, etc.). The memory device 310 may include an array of memory cells 360 arranged in rows 345 and columns 355. A set of rows 345 may be grouped into a row group 350, such as row group 350-a, 350-b, 350-c, and 350-d. In the exampled illustrated herein, a row group 350 may include four rows 345. However, a row group 350 may include any quantity of rows 345. For example, the quantity of rows 345 in a row group 350 may be configurable (e.g., by the host device 305 or another device), or the quantity of rows 345 in a row group 350 may be based on one or more parameters of the memory device 310, such as a device identifier.

The sense component 245-a of the memory device 310 may include a connection 335 with the memory array of the memory device 310. In some examples, the connection 335 may be an example of digit lines 215 (e.g., bit lines, column lines). The sense component 245-a include one or more sense amplifiers (e.g., a sense amplifier array) coupled with rows 345. In some cases, two or more rows 345 may share a same sense amplifier. The row groups 350 may be implemented such that rows 345 that share a same sense amplifier are not part of the same row group 350.

The host device 305 may communicate (e.g., through the memory controller 315) an activation command (which in some examples may be referred to as an ACTIVATE_TO_ROW_GROUP command or an ACT_RG command) to the memory device 310 to activate (e.g., open) a group of rows 345 of a row group 350. The activation command may be or include a row group address corresponding to a row group 350 of the memory device 310. For example, the row group address may indicate row group 350-b for activation using a set of bits identifying the rows 345 of the row group 350-b. In some cases, the row group address may be or include a set of bits representing the most significant bits of a memory address corresponding to the set of rows 345 in the row group 350-b. For example, if a row group 350 includes $2^n$ rows 345 and a memory address corresponding to a row 345 is 16 bits, the row group address may be bits [15:n] of the memory address. As illustrated in FIG. 3, row group 350-b includes four rows 345, and the row group address may be or include a set of bits (e.g., bits [15:2]) common to the memory addresses of the rows 345 in the row group 350-b, omitting the two least significant bits of each memory address, which may be unique to each row 345 of the row group 350-b.

The memory device 310 may activate (e.g., using the row decoder 220-a) access lines 340 associated with each row 345 of the row group 350-b. This may enable each row 345 of row group 350-b to be written to by the sense component 245-a in response to receiving a write command. In some examples, an access line 340 may be an example of a word line 210 as described herein with reference to FIG. 2. In some examples, the rows 345 opened by the memory device 310 may be opened concurrently, so that they may share the contents in sense amplifiers coupled with each row 345.

The host device 305 may communicate (e.g., through the memory controller 315) a write command (which in some examples may be referred to as a WRITE_TO_ROW_GROUP command or a WRITE_RG command) to the memory device 310 to write (e.g., store) data (e.g., a logic state) in memory cells 360. In some cases, the write command may be received after receiving an activation command from the host device 305 to open a row group 350. For example, the memory device 310 may write data to a respective memory cell 360 within each row 345 of the row group 350-b in response to receiving the write command.

The memory device 310 may store a same logic state in each memory cell 360. In some examples, the logic state may be specified in the write command received from the host device 305. Additionally, or alternatively, the write command may include a column address, where the memory device 310 may store data in memory cells 360 with the same column address. For example, the memory device 310 may store the same logic state in each memory cell 360 in row group 350-b that is located in column 355-a in response to receiving the write command. The memory device 310 may write data by applying a signal (e.g., a write pulse, a write voltage) to a connection associated with column 355-a as described herein with reference to FIG. 2. For example, the memory device 310 may transfer data to a memory cell 360 of a row 345 via the connection 335 (e.g., a bit line, digit line) coupled with the memory cell 360.

The host device 305 may communicate (e.g., through the memory controller 315) a precharge command (which in some examples may be referred to as a PRECHARGE_ROW_GROUP command or a PRE_RG command) to the memory device 310 to close a group of rows 345 of a row group 350. For example, the rows 345 in row group 350-b that were opened in response to receiving the activation command may be closed in response to receiving the precharge command.

In some cases, the memory system 300 may be subject to one or more configured timing constraints, for example according to an industry standard specification (e.g., a JEDEC DDR5 specification). The timing constraints may be configured for the memory system 300 (e.g., host device 305 or memory device 310) and may specify timings to be satisfied when the host device 305 issues commands to the memory device 310. The memory system 300 may be configured with timings for performing operations relating to a single row 345. A row access to column access delay (such as tRCD) may represent a minimum duration between an activation command and an associated data access command, which may be based on a capability of the memory device 310. An activation command window (e.g., a four activation window (such as tFAW)) may be a rolling duration in which a configured quantity of activation commands (e.g., four activation commands) may be received and processed at the memory device 310. An activation command delay, such as a row activation delay (e.g., a row-to-row activation delay (such as tRRD)) or a column activation delay (e.g., a column-to-column activation delay (such as tCCD)), may be a duration between consecutive activation commands. In some examples, such as when the host device 305 transmits (e.g., issues) consecutive activation commands to banks of different bank groups of the memory array at the memory device 310, the row activation delay may be a shortened row activation delay (such as tRRD_S) or the column activation delay may be a shortened column activation delay (such as tCCD_S).

In some cases, the memory system 300 may be configured with different timings for use with commands for performing operations for a row group 350, for example, to accommodate different durations associated with operating multiple rows 345 concurrently. For example, the memory device 310 may receive a write command a duration different (e.g., longer) than tRCD after receiving an activation command. Similarly, the memory device 310 may perform the precharge operation in response to a precharge command in a duration different (e.g., longer) than tRP. Additionally, or alternatively, the memory system 300 may be configured to perform the operations for a row group 350 using different (e.g., higher) currents than currents configured for performing operations relating to a single row 345.

Executing a command operation may include executing a collection of internal operations. For example, executing an activation operation at a row group 350 may include executing a first collection of phase-controlled internal operations, executing a write operation at a row group 350 may include executing a second collection of phase-controlled internal operations, and executing a precharge operation at a row group 350 may include executing a third collection of phase-controlled internal operations. Thus, the phases may influence (e.g., determine) the internal timing of the operations at a given row group 350 to which the commands are directed. In some examples, the phases may be internal timing signals that trigger the electrical operations (e.g., the physical electrical operations) corresponding to the command operations on an individual row basis to access memory cells of a given row group 350.

All three operations may be performed to write to a row group 350 of memory device 310. In some examples, the activation operation may be performed before a write operation to open the rows 345 of row group 350. Additionally, the precharge operation may be performed to close the activated rows 345 of row group 350. The corresponding commands may be communicated from memory controller 315 to memory device 310 as a series of commands (e.g., as a command sequence). The commands may include an activation command, a write command, and a precharge command, and may be received in the order the corresponding operations are performed. Performing these operations to write to a row group 350 may allow the memory device 310 may perform operations, such as those directed by the ECC 320, faster than if the memory device 310 were to perform separate operations to write to individual rows 345.

Figure 4:
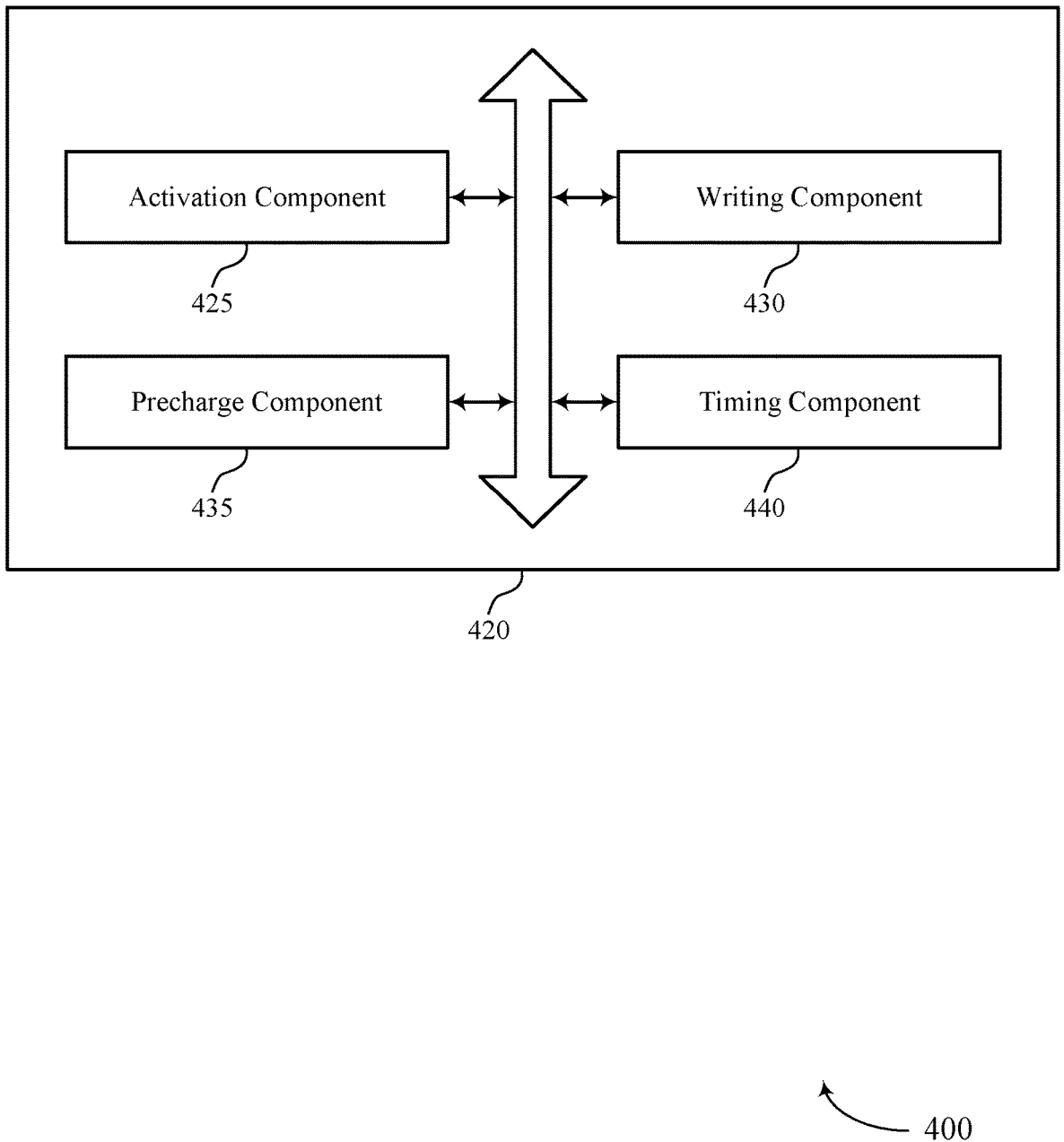
FIG. 4 shows a block diagram of a memory device that supports techniques for initializing memory error correction in accordance with examples as disclosed herein.

FIG. 4 shows a block diagram 400 of a memory device 420 that supports techniques for initializing memory error correction in accordance with examples as disclosed herein. The memory device 420 may be an example of aspects of a memory device as described with reference to FIGS. 1 through 3. The memory device 420, or various components thereof, may be an example of means for performing various aspects of techniques for initializing memory error correction as described herein. For example, the memory device 420 may include an activation component 425, a writing component 430, a precharge component 435, a timing component 440, or any combination thereof. Each of these components may communicate, directly or indirectly, with one another (e.g., via one or more buses).

The activation component 425 may be configured as or otherwise support a means for receiving an activation command to open a set of rows of a memory device, each row of the set of rows corresponding to a set of memory cells. In some examples, the activation component 425 may be configured as or otherwise support a means for activating a set of word lines in response to the activation command, each word line of the set of word lines coupled with a respective row of the set of rows. The writing component 430 may be configured as or otherwise support a means for storing a same logic state in a respective memory cell of each row of the set of rows based at least in part on activating the set of word lines.

In some examples, the writing component 430 may be configured as or otherwise support a means for receiving a write command after receiving the activation command, where storing the same logic state in the respective memory cell of each row of the set of rows is in response to the write command.

In some examples, to support storing the same logic state, the writing component 430 may be configured as or otherwise support a means for transferring data to the respective memory cell of each row of the set of rows via a set of bit lines, the respective memory cell of each row coupled with a respective bit line of the set of bit lines.

In some examples, the write command is received a duration after receiving the activation command. In some examples, the duration is different than a row address to column address delay.

In some examples, the precharge component 435 may be configured as or otherwise support a means for receiving a precharge command to close the set of rows after storing the same logic state in the respective memory cell of each row of the set of rows.

In some examples, the timing component 440 may be configured as or otherwise support a means for generating, based at least in part on receiving the precharge command, a set of timing signals to close the set of rows. In some examples, the precharge component 435 may be configured as or otherwise support a means for performing a precharge operation to close the set of rows based at least in part on generating the set of timing signals, where a duration of the precharge operation is different than a row precharge time.

In some examples, each row of the set of rows is coupled with a respective sense amplifier of a set of sense amplifiers.

In some examples, the respective memory cell of each row of the set of rows in which the same logic state is stored has a same column address.

In some examples, the activation command includes one or more bits identifying the set of rows. In some examples, a respective row address of each row of the set of rows includes the one or more bits.

In some examples, the one or more bits include one or more most significant bits (MSBs) of the respective row address of each row of the set of rows.

Figure 5:
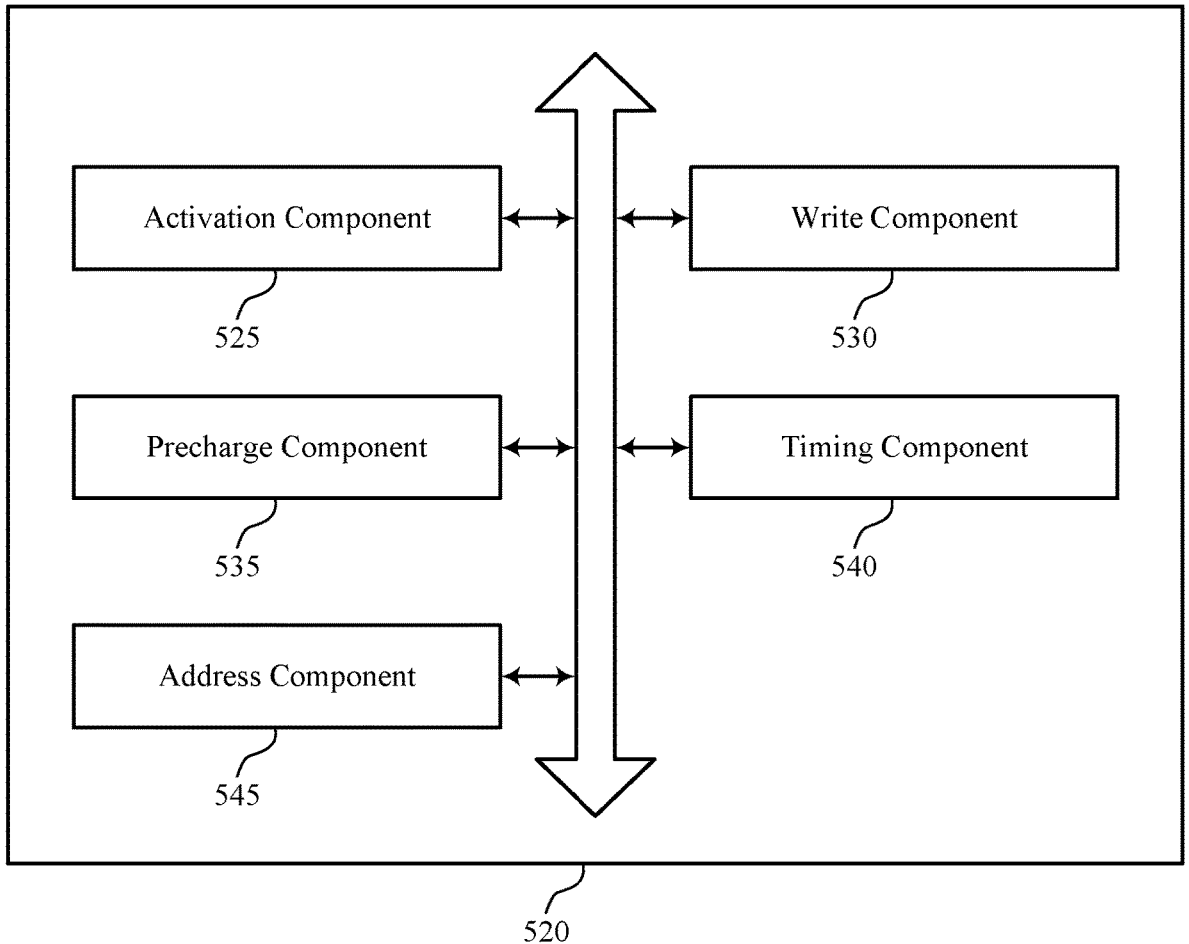
FIG. 5 shows a block diagram of a host device that supports techniques for initializing memory error correction in accordance with examples as disclosed herein.

FIG. 5 shows a block diagram 500 of a host device 520 that supports techniques for initializing memory error correction in accordance with examples as disclosed herein. The host device 520 may be an example of aspects of a host device as described with reference to FIGS. 1 through 3. The host device 520, or various components thereof, may be an example of means for performing various aspects of techniques for initializing memory error correction as described herein. For example, the host device 520 may include an activation component 525, a write component 530, a precharge component 535, a timing component 540, an address component 545, or any combination thereof. Each of these components may communicate, directly or indirectly, with one another (e.g., via one or more buses).

The activation component 525 may be configured as or otherwise support a means for transmitting an activation command to open a set of rows of a memory device, each row of the set of rows corresponding to a set of memory cells at the memory device. The write component 530 may be configured as or otherwise support a means for transmitting a write command after transmitting the activation command, the write command indicating a same logic state is to be stored in a respective memory cell of each row of the set of rows. The precharge component 535 may be configured as or otherwise support a means for transmitting a precharge command to close the set of rows after storage of the same logic state in the respective memory cell of each row of the set of rows.

In some examples, the write command is transmitted a duration after transmitting the activation command. In some examples, the duration is different than a row address to column address delay.

In some examples, the activation command is transmitted based at least in part on each row of the set of rows being coupled with a respective sense amplifier of a set of sense amplifiers.

In some examples, the respective memory cell of each row of the set of rows in which the same logic state is stored has a same column address.

In some examples, the activation command includes one or more bits identifying the set of rows. In some examples, a respective row address of each row of the set of rows includes the one or more bits.

In some examples, the one or more bits include one or more most significant bits (MSBs) of the respective row address of each row of the set of rows.

Figure 6:
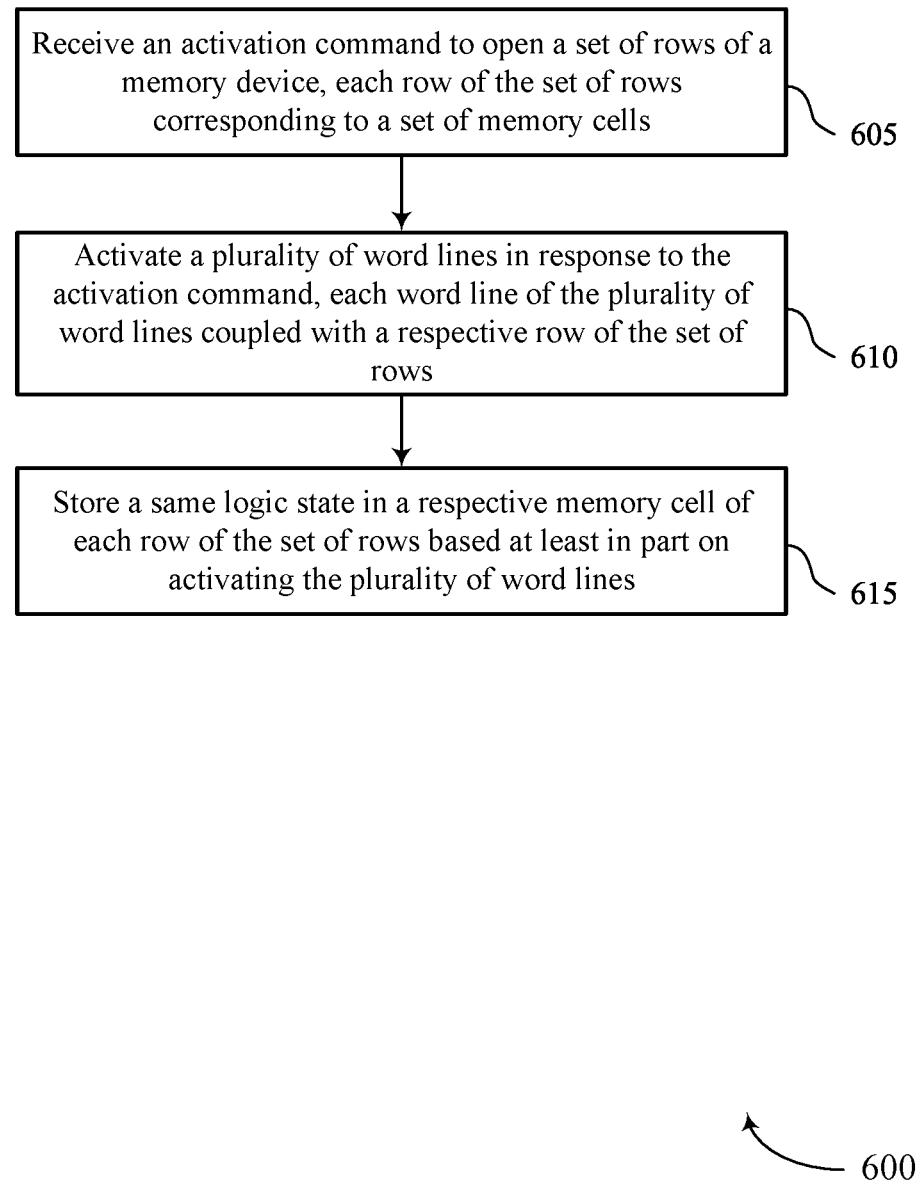
FIGS. 6 and 7 show flowcharts illustrating a method or methods that support techniques for initializing memory error correction in accordance with examples as disclosed herein.

FIG. 6 shows a flowchart illustrating a method 600 that supports techniques for initializing memory error correction in accordance with examples as disclosed herein. The operations of method 600 may be implemented by a memory device or its components as described herein. For example, the operations of method 600 may be performed by a memory device as described with reference to FIGS. 1 through 4. In some examples, a memory device may execute a set of instructions to control the functional elements of the device to perform the described functions. Additionally, or alternatively, the memory device may perform aspects of the described functions using special-purpose hardware.

At 605, the method may include receiving an activation command to open a set of rows of a memory device, each row of the set of rows corresponding to a set of memory cells. The operations of 605 may be performed in accordance with examples as disclosed herein. In some examples, aspects of the operations of 605 may be performed by an activation component 425 as described with reference to FIG. 4.

At 610, the method may include activating a plurality of word lines in response to the activation command, each word line of the plurality of word lines coupled with a respective row of the set of rows. The operations of 610 may be performed in accordance with examples as disclosed herein. In some examples, aspects of the operations of 610 may be performed by an activation component 425 as described with reference to FIG. 4.

At 615, the method may include storing a same logic state in a respective memory cell of each row of the set of rows based at least in part on activating the plurality of word lines. The operations of 615 may be performed in accordance with examples as disclosed herein. In some examples, aspects of the operations of 615 may be performed by a writing component 430 as described with reference to FIG. 4.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving an activation command to open a set of rows of a memory device, each row of the set of rows corresponding to a set of memory cells; activating a plurality of word lines in response to the activation command, each word line of the plurality of word lines coupled with a respective row of the set of rows; and storing a same logic state in a respective memory cell of each row of the set of rows based at least in part on activating the plurality of word lines.

Aspect 2: The method, apparatus, or non-transitory computer-readable medium of aspect 1, further including operations, features, circuitry, logic, means, or instructions, or any combination thereof for receiving a write command after receiving the activation command, where storing the same logic state in the respective memory cell of each row of the set of rows is in response to the write command.

Aspect 3: The method, apparatus, or non-transitory computer-readable medium of aspect 2 where storing the same logic state includes operations, features, circuitry, logic, means, or instructions, or any combination thereof for transferring data to the respective memory cell of each row of the set of rows via a set of bit lines, the respective memory cell of each row coupled with a respective bit line of the set of bit lines.

Aspect 4: The method, apparatus, or non-transitory computer-readable medium of any of aspects 2 through 3 where the write command is received a duration after receiving the activation command and the duration is different than a row address to column address delay.

Aspect 5: The method, apparatus, or non-transitory computer-readable medium of any of aspects 1 through 4, further including operations, features, circuitry, logic, means, or instructions, or any combination thereof for receiving a precharge command to close the set of rows after storing the same logic state in the respective memory cell of each row of the set of rows.

Aspect 6: The method, apparatus, or non-transitory computer-readable medium of aspect 5, further including operations, features, circuitry, logic, means, or instructions, or any combination thereof for generating, based at least in part on receiving the precharge command, a set of timing signals to close the set of rows and performing a precharge operation to close the set of rows based at least in part on generating the set of timing signals, where a duration of the precharge operation is different than a row precharge time.

Aspect 7: The method, apparatus, or non-transitory computer-readable medium of any of aspects 1 through 6 where each row of the set of rows is coupled with a respective sense amplifier of a set of sense amplifiers.

Aspect 8: The method, apparatus, or non-transitory computer-readable medium of any of aspects 1 through 7 where the respective memory cell of each row of the set of rows in which the same logic state is stored has a same column address.

Aspect 9: The method, apparatus, or non-transitory computer-readable medium of any of aspects 1 through 8 where the activation command includes one or more bits identifying the set of rows and a respective row address of each row of the set of rows includes the one or more bits.

Aspect 10: The method, apparatus, or non-transitory computer-readable medium of aspect 9 where the one or more bits include one or more most significant bits (MSBs) of the respective row address of each row of the set of rows.

Figure 7:
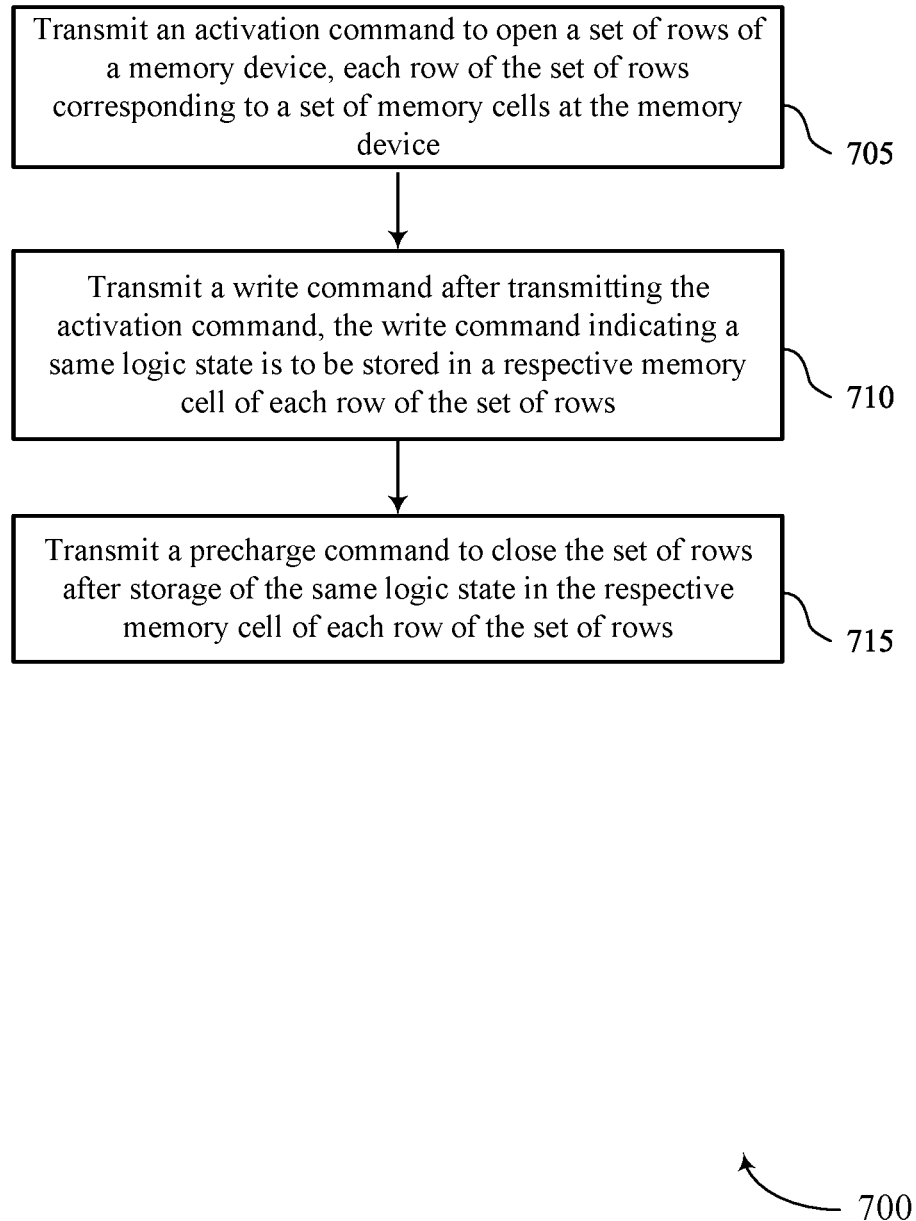

FIG. 7 shows a flowchart illustrating a method 700 that supports techniques for initializing memory error correction in accordance with examples as disclosed herein. The operations of method 700 may be implemented by a host device or its components as described herein. For example, the operations of method 700 may be performed by a host device as described with reference to FIGS. 1 through 3 and 5. In some examples, a host device may execute a set of instructions to control the functional elements of the device to perform the described functions. Additionally, or alternatively, the host device may perform aspects of the described functions using special-purpose hardware.

At 705, the method may include transmitting an activation command to open a set of rows of a memory device, each row of the set of rows corresponding to a set of memory cells at the memory device. The operations of 705 may be performed in accordance with examples as disclosed herein. In some examples, aspects of the operations of 705 may be performed by an activation component 525 as described with reference to FIG. 5.

At 710, the method may include transmitting a write command after transmitting the activation command, the write command indicating a same logic state is to be stored in a respective memory cell of each row of the set of rows. The operations of 710 may be performed in accordance with examples as disclosed herein. In some examples, aspects of the operations of 710 may be performed by a write component 530 as described with reference to FIG. 5.

At 715, the method may include transmitting a precharge command to close the set of rows after storage of the same logic state in the respective memory cell of each row of the set of rows. The operations of 715 may be performed in accordance with examples as disclosed herein. In some examples, aspects of the operations of 715 may be performed by a precharge component 535 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for transmitting an activation command to open a set of rows of a memory device, each row of the set of rows corresponding to a set of memory cells at the memory device; transmitting a write command after transmitting the activation command, the write command indicating a same logic state is to be stored in a respective memory cell of each row of the set of rows; and transmitting a precharge command to close the set of rows after storage of the same logic state in the respective memory cell of each row of the set of rows.

Aspect 12: The method, apparatus, or non-transitory computer-readable medium of aspect 11 where the write command is transmitted a duration after transmitting the activation command and the duration is different than a row address to column address delay.

Aspect 13: The method, apparatus, or non-transitory computer-readable medium of any of aspects 11 through 12 where the activation command is transmitted based at least in part on each row of the set of rows being coupled with a respective sense amplifier of a set of sense amplifiers.

Aspect 14: The method, apparatus, or non-transitory computer-readable medium of any of aspects 11 through 13 where the respective memory cell of each row of the set of rows in which the same logic state is stored has a same column address.

Aspect 15: The method, apparatus, or non-transitory computer-readable medium of any of aspects 11 through 14 where the activation command includes one or more bits identifying the set of rows and a respective row address of each row of the set of rows includes the one or more bits.

Aspect 16: The method, apparatus, or non-transitory computer-readable medium of aspect 15 where the one or more bits include one or more most significant bits (MSBs) of the respective row address of each row of the set of rows.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 17: An apparatus, including: a controller associated with a memory device, where the controller is configured to cause the apparatus to: receive an activation command to open a set of rows of the memory device, each row of the set of rows corresponding to a set of memory cells; activate a plurality of word lines in response to the activation command, each word line of the plurality of word lines coupled with a respective row of the set of rows; and store a same logic state in a respective memory cell of each row of the set of rows based at least in part on activating the plurality of word lines.

Aspect 18: The apparatus of aspect 17, where the controller is further configured to cause the apparatus to: receive a write command after receiving the activation command, where storing the same logic state in the respective memory cell of each row of the set of rows is in response to the write command.

Aspect 19: The apparatus of aspect 18, where, to store the same logic state, the controller is further configured to cause the apparatus to: transfer data to the respective memory cell of each row of the set of rows via a set of bit lines, the respective memory cell of each row coupled with a respective bit line of the set of bit lines.

Aspect 20: The apparatus of any of aspects 18 through 19, where: the write command is received a duration after receiving the activation command; and the duration is different than a row address to column address delay.

Aspect 21: The apparatus of any of aspects 17 through 20, where the controller is further configured to cause the apparatus to: receive a precharge command to close the set of rows after storing the same logic state in the respective memory cell of each row of the set of rows.

Aspect 22: The apparatus of aspect 21, where the controller is further configured to cause the apparatus to: generate, based at least in part on receiving the precharge command, a set of timing signals to close the set of rows; and perform a precharge operation to close the set of rows based at least in part on generating the set of timing signals, where a duration of the precharge operation is different than a row precharge time.

Aspect 23: The apparatus of any of aspects 17 through 22, where each row of the set of rows is coupled with a respective sense amplifier of a set of sense amplifiers.

Aspect 24: The apparatus of any of aspects 17 through 23, where the respective memory cell of each row of the set of rows in which the same logic state is stored has a same column address.

Aspect 25: The apparatus of any of aspects 17 through 24, where: the activation command includes one or more bits identifying the set of rows; and a respective row address of each row of the set of rows includes the one or more bits.

Aspect 26: The apparatus of aspect 25, where the one or more bits include one or more most significant bits (MSBs) of the respective row address of each row of the set of rows.

An apparatus is described. The following provides an overview of aspects of the apparatus as described herein:

Aspect 27: An apparatus, including: a controller associated with a memory device, where the controller is configured to cause the apparatus to: transmit an activation command to open a set of rows of the memory device, each row of the set of rows corresponding to a set of memory cells at the memory device; transmit a write command after transmitting the activation command, the write command indicating a same logic state is to be stored in a respective memory cell of each row of the set of rows; and transmit a precharge command to close the set of rows after storage of the same logic state in the respective memory cell of each row of the set of rows.

Aspect 28: The apparatus of aspect 27, where: the write command is transmitted a duration after transmitting the activation command; and the duration is different than a row address to column address delay.

Aspect 29: The apparatus of any of aspects 27 through 28, where the activation command is transmitted based at least in part on each row of the set of rows being coupled with a respective sense amplifier of a set of sense amplifiers.

Aspect 30: The apparatus of any of aspects 27 through 29, where the respective memory cell of each row of the set of rows in which the same logic state is stored has a same column address.

Aspect 31: The apparatus of any of aspects 27 through 30, where: the activation command includes one or more bits identifying the set of rows; and a respective row address of each row of the set of rows includes the one or more bits.

Aspect 32: The apparatus of aspect 31, where the one or more bits include one or more most significant bits (MSBs) of the respective row address of each row of the set of rows.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving an activation command to open a set of rows, each row of the set of rows corresponding to a set of memory cells;
   activating a plurality of word lines in response to the activation command, each word line of the plurality of word lines coupled with a respective row of the set of rows; and
   storing a same logic state in a respective memory cell of each row of the set of rows based at least in part on activating the plurality of word lines.

2. The method of claim 1, further comprising:
   receiving a write command after receiving the activation command, wherein storing the same logic state in the respective memory cell of each row of the set of rows is in response to the write command.

3. The method of claim 2, wherein storing the same logic state comprises:
   transferring data to the respective memory cell of each row of the set of rows via a set of bit lines, the respective memory cell of each row coupled with a respective bit line of the set of bit lines.

4. The method of claim 2, wherein:
   the write command is received a duration after receiving the activation command; and
   the duration is different than a row address to column address delay.

5. The method of claim 1, further comprising:
   receiving a precharge command to close the set of rows after storing the same logic state in the respective memory cell of each row of the set of rows.

6. The method of claim 5, further comprising:
   generating, based at least in part on receiving the precharge command, a set of timing signals to close the set of rows; and
   performing a precharge operation to close the set of rows based at least in part on generating the set of timing signals, wherein a duration of the precharge operation is different than a row precharge time.

7. The method of claim 1, wherein each row of the set of rows is coupled with a respective sense amplifier of a set of sense amplifiers.

8. The method of claim 1, wherein the respective memory cell of each row of the set of rows in which the same logic state is stored has a same column address.

9. The method of claim 1, wherein:
   the activation command comprises one or more bits identifying the set of rows; and
   a respective row address of each row of the set of rows comprises the one or more bits.

10. The method of claim 9, wherein the one or more bits comprise one or more most significant bits (MSBs) of the respective row address of each row of the set of rows.

11. A memory system, comprising:
    one or more memory devices; and
    processing circuitry coupled with the one or more memory devices and configured to cause the memory system to:
    receive an activation command to open a set of rows, each row of the set of rows corresponding to a set of memory cells;
    activate a plurality of word lines in response to the activation command, each word line of the plurality of word lines coupled with a respective row of the set of rows; and
    store a same logic state in a respective memory cell of each row of the set of rows based at least in part on activating the plurality of word lines.

12. The memory system of claim 11, wherein the processing circuitry is further configured to cause the memory system to:
    receive a write command after receiving the activation command, wherein storing the same logic state in the respective memory cell of each row of the set of rows is in response to the write command.

13. The memory system of claim 12, wherein:
    the write command is received a duration after receiving the activation command; and
    the duration is different than a row address to column address delay.

14. The memory system of claim 11, wherein the processing circuitry is further configured to cause the memory system to:
    receive a precharge command to close the set of rows after storing the same logic state in the respective memory cell of each row of the set of rows.

15. The memory system of claim 11, wherein each row of the set of rows is coupled with a respective sense amplifier of a set of sense amplifiers.

16. The memory system of claim 11, wherein the respective memory cell of each row of the set of rows in which the same logic state is stored has a same column address.

17. The memory system of claim 11, wherein:
    the activation command comprises one or more bits identifying the set of rows; and
    a respective row address of each row of the set of rows comprises the one or more bits.

18. The memory system of claim 17, wherein the one or more bits comprise one or more most significant bits (MSBs) of the respective row address of each row of the set of rows.

19. The memory system of claim 12, wherein, to store the same logic state, the processing circuitry is further configured to cause the memory system to:
    transfer data to the respective memory cell of each row of the set of rows via a set of bit lines, the respective memory cell of each row coupled with a respective bit line of the set of bit lines.

20. The memory system of claim 14, wherein the processing circuitry is further configured to cause the memory system to:
    generate, based at least in part on receiving the precharge command, a set of timing signals to close the set of rows; and
    perform a precharge operation to close the set of rows based at least in part on generating the set of timing signals, wherein a duration of the precharge operation is different than a row precharge time.

21. A non-transitory computer-readable medium storing code, the code comprising instructions executable by processing circuitry to:
- receive an activation command to open a set of rows, each row of the set of rows corresponding to a set of memory cells;
- activate a plurality of word lines in response to the activation command, each word line of the plurality of word lines coupled with a respective row of the set of rows; and
- store a same logic state in a respective memory cell of each row of the set of rows based at least in part on activating the plurality of word lines.

22. The non-transitory computer-readable medium of claim 21, wherein the instructions are further executable by the processing circuitry to:
- receive a write command after receiving the activation command, wherein storing the same logic state in the respective memory cell of each row of the set of rows is in response to the write command.

23. The non-transitory computer-readable medium of claim 22, wherein, to store the same logic state, the instructions are further executable by the processing circuitry to:
- transfer data to the respective memory cell of each row of the set of rows via a set of bit lines, the respective memory cell of each row coupled with a respective bit line of the set of bit lines.

24. The non-transitory computer-readable medium of claim 22, wherein:
- the write command is received a duration after receiving the activation command; and
- the duration is different than a row address to column address delay.

25. The non-transitory computer-readable medium of claim 21, wherein the instructions are further executable by the processing circuitry to:
- receive a precharge command to close the set of rows after storing the same logic state in the respective memory cell of each row of the set of rows.

* * * * *